United States Patent [19]

Olk et al.

[11] Patent Number: 5,038,131

[45] Date of Patent: Aug. 6, 1991

[54] MAGNETORESISTOR

[75] Inventors: Charles H. Olk, Leonard; Joseph P. Heremans, Troy, both of Mich.

[73] Assignee: General Motors Corporation, Detroit, Mich.

[21] Appl. No.: 483,689

[22] Filed: Feb. 23, 1990

[51] Int. Cl.$^5$ .............................................. H01L 43/00
[52] U.S. Cl. ................................. 338/32 R; 338/32 H; 324/252
[58] Field of Search ................. 338/32 R, 32 H, 32 S; 324/117 R, 207.13, 252, 235, 249, 207.21; 329/200; 360/113, 119, 120, 121, 125, 126

[56] References Cited

U.S. PATENT DOCUMENTS

| | | | |
|---|---|---|---|
| 3,789,311 | 1/1974 | Masuda | 338/32 H |
| 3,898,359 | 8/1975 | Nadkerni | 428/209 |
| 4,224,594 | 9/1980 | Anthony et al. | 338/32 R |
| 4,926,154 | 5/1990 | Heremans et al. | 338/32 R |
| 4,939,456 | 7/1990 | Morelli et al. | 324/207.21 |
| 4,978,938 | 12/1990 | Partin et al. | 338/32 R |

OTHER PUBLICATIONS

S. Kataoka, "Recent Developments of Magnetoresistive Devices and Applications", *Circulars of the Electrotechnical Laboratory*, No. 182, Agency of Industrial Science and Technology, Tokyo, (Dec. 1974).
H. H. Wieder, "Transport Coefficients of Indium Arsenide Epilayers", *Applied Physics Letters*, vol. 25, No. 4, pp. 206–208, (Aug. 15, 1974).
G. Burns, *Solid State Physics*, Sections 18-5 and 18-6, pp. 726–747, Academic Press, Inc., Harcourt Brace Jovanovich, Publishers, New York, 1985.
H. P. Baltes and R. S. Popovic, "Ingrated Semiconductor Magnetic Field Sensors", *Proceedings of the IEEE*, vol. 74, No. 8, pp. 1107–1132, (Aug. 1986).
S. Kalem, J.-I. Chyi and H. Morkoc, "Growth and Transport Properties of InAs Epilayers on GaAs", *Applied Physics Letters*, vol. 53, No. 17, pp. 1647–1649, (Oct. 24, 1988).
V. S. Tsoi, "Focusing of Electrons in a Metal by a Transverse Magnetic Field", *ZhETF Pis. Red.*, vol. 19, No. 2, pp. 114–116, (Jan. 20, 1974).
V. S. Tsoi, "Investigation of the Interaction Between Electrons and a Boundary by Means of Transverse Focusing", *Sov. Phys.-JETP*, vol. 41, No. 5, pp. 927–931, (1975); from *Zh. Eksp. Teor. Fiz.*, vol. 68, pp. 1849–1858, (May 1975).
J. Volger, "Note on the Hall Potential Across an Inhomogeneous Conductor", *Physical Reviews*, vol. 79, pp. 1023–1024, (1950).
J. M. Ziman, Chapter XI, *Electrons and Phonons, The Theory of Transport Phenomena in Solids*, pp. 450–482, Oxford University Press, Oxford, England, Copyright 1960 and 1979.

*Primary Examiner*—Marvin M. Lateef
*Attorney, Agent, or Firm*—Robert J. Wallace

[57] ABSTRACT

A magnetoresistor includes a thin film of a degenerately doped semiconductor material extending between conductive contacts at opposite edges of the film. The film has a plurality of openings therethrough which are arranged in spaced parallel rows with the openings in each row being between two openings in the adjacent rows. This forms the film into two set of paths which extend around the openings. The openings are selected to be of a size such that when a magnetic field is applied perpendicular to the film, the resistance of the magnetoresistor increases because electron flow through the film between the contacts must be in a substantially circular path around the openings.

9 Claims, 1 Drawing Sheet

5,038,131

MAGNETORESISTOR

FIELD OF THE INVENTION

The present invention relates to a thin film magnetoresistor and, more particularly, to a cyclotron magnetoresistor having a high resistance and low temperature coefficient.

BACKGROUND OF THE INVENTION

Magnetoresistors are resistors whose resistance is varied by applying a magnetic field across the resistor. Magnetoresistors can be used, in conjunction with a permanent magnet, to sense the distance between the magnet and the magnetoresistors. This leads to their potential application in position sensing devices, such as used in the automotive industry. There are essentially two classes of magnetoresistors. One class of these devices, known as magnetodiodes, operates on the bases of selective reCOmbination of electrons and holes. The other class operates on the deflection of the current paths in a rectangular or circular resistor. The performance of the first class of devices depends strongly on the electron-hole recombination rate, and the performance of the second class of devices depends on the carrier mobilities. Both the electron-hole recombination rate and the carrier mobilities are temperature dependent quantities. Thus, to date, most field sensors using these magnetoresistors have large temperature coefficients. In the automotive industry, where there are wide variations in the temperature to which these sensors are subjected, it would be desirable to have a magnetoresistor which not only has a large variation in resistance, but also has a low temperature coefficient.

SUMMARY OF THE INVENTION

The present invention is directed to a thin film magnetoresistor in which the path of the resistance material is such that when the device is subjected to a magnetic field, electrons flow in substantially a circular path so as to increase the resistance of the device. More particularly, the magnetoresistor comprises a thin film of a degenerately doped semiconductor material having a pair of conductive contacts at opposite ends of the film. The film is in the form of a series of paths which extend at least partially in a substantially circular pattern. Thus, with a magnetic field applied perpendicular to the film, electrons flow between the contacts in a substantially circular pattern and thereby increase the resistance between the contacts.

The invention will be better understood from the following more detailed description taken with the accompanying drawings and claims.

The drawings are not necessarily to scale.

DETAILED DESCRIPTION

Figure 1:
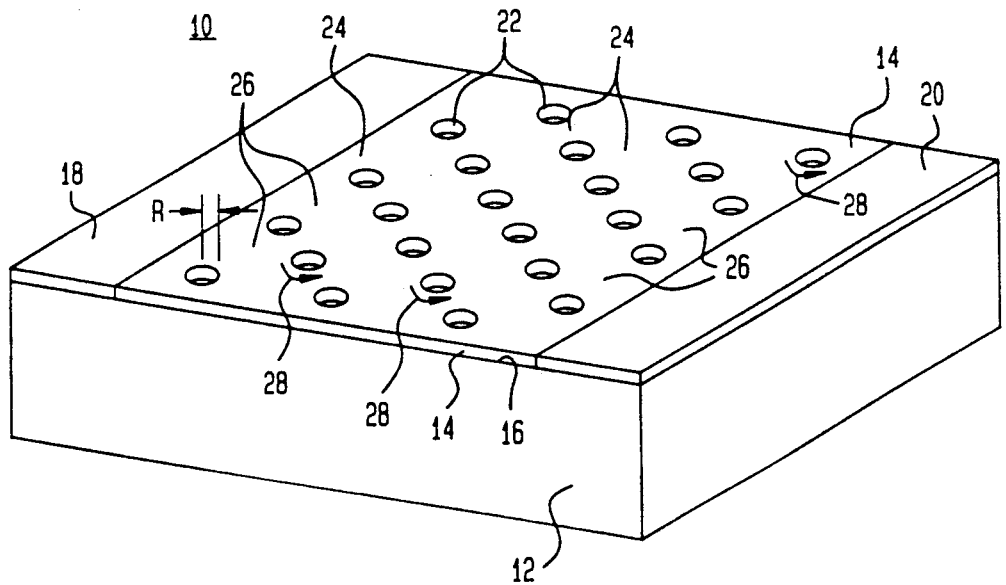
FIG. 1 is a perspective view of a magnetoresistor made in accordance with the present invention.

Referring to FIG. 1, there is shown a prospective view of a magnetoresistor 10 in accordance with the present invention. The magnetoresistor 10 comprises a substrate 12 of an insulating material, such as iron doped gallium arsenide, having a thin film 14 of a degenerately doped semiconductor material, such as indium arsenide or indium antimonide, on a surface 16 thereof. The semiconductor film 14, which is the active layer of the magnetoresistor, is of a thickness of no greater than about 5 micrometers, and preferably no greater than about 3 micrometers. The semiconductor film 14 is substantially rectangular, and separate conductive contacts 18 and 20 are on the substrate surface 16 at opposite edges of the semiconductor film 14. The contacts 18 and 20 are in ohmic contact with the semiconductor film 14.

The semiconductor film 14 has a plurality of openings 22 therethrough in the form of circular holes which are arranged in spaced parallel rows extending across the film 14 parallel to the contacts 18 and 20. The holes 22 in alternate rows are arranged between the holes 22 in the adjacent rows. This forms the film 14 into a plurality of spaced paths 24 which extend across the film 14 parallel to the contacts 18 and 20, and a plurality of spaced paths 26 which extend between the paths 24 substantially perpendicular to the contacts 18 and 20. The spacing between the holes 22, i.e., the width of the paths 24 and 26, should be no greater than the mean free path of electrons in the semiconductor film 14. The holes 22 should have a radius such that the perimeter (circumference) of the hole is no greater than the mean free path of electrons in semiconductor material of film 14. For example, in gallium arsenide or indium arsenide at room temperature, the mean free path is about 3000 Angstroms.

In the presence of a magnetic field B (shown as a circle with a dot in the center thereof) along an axis perpendicular to the surface of the semiconductor film 14, the inplane trajectory of the electrons through the semiconductor film 14 and along the paths 4 and 26 is deflected by the Lorentz law of force to be an arc of a circle in the plane of the semiconductor film 14 with the radius of the circle, $R_H$, the cyclotron radius, being:

$$R_H = mv/eB$$

where m is the electron effective mass, v is its total velocity, e is the elemental electron charge, and B is the applied magnetic field. When the magnetic field B is such that the radius R of each hole 22 equals the cyclotron radius $R_H$, each hole 22 acts as a minuscule cyclotron, and electrons flow along the paths 24 and 26 around the holes 22 as indicated by the arrows 28. The electrons so flow until they either recombine or scatter. This results in an increase in the resistance of the magnetoresistor 10. The field at which this occurs is only a function of the geometry. This is so because the electron effective mass, and its Fermi velocity are parameters which are quite temperature independent in degenerate semiconductors. Thus, the magnetoresistor 10 has a high resistance and a low temperature coefficient.

Figure 2:
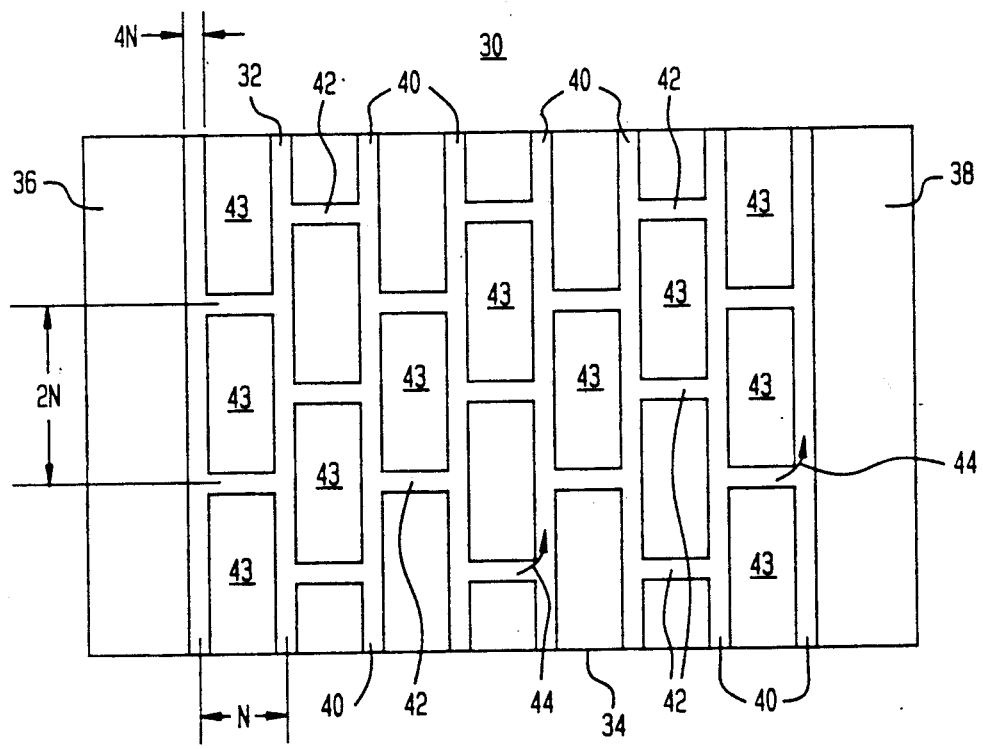
FIG. 2 is a top plan view of another magnetoresistor in accordance with the invention.

Referring to FIG. 2, there is shown a top plan view of another magnetoresistor 30 in accordance with the present invention. The magnetoresistor 30 comprises a thin film 32 of degenerated semiconductor material on the surface of an insulating substrate 34, and conductive contacts 36 and 38 on the substrate at opposite ends of the semiconductor film 32. The semiconductor film 32 comprises a plurality of spaced, parallel first paths 40 extending parallel to the contacts 36 and 38, and a plurality of spaced second paths 42 extending between the first paths 40 substantially perpendicular to the contacts 36 and 38. The second paths 42 between two adjacent first paths 40 are not aligned with the second paths 42 between the next adjacent pairs of first paths 40 so as to form openings 43 which are arranged in a substantially staggered brick work pattern. The spacing N between adjacent first paths 40 is no greater than one-third the mean free path of electrons in the semiconductor film 32, and preferably smaller than one-third the mean free path. The spacing 2N between adjacent second paths 42 is about twice the spacing between adjacent first paths 40. The thickness of the paths 40 and 42 is about 2/5N.

In the operation of the magnetoresistor 30, a voltage applied between the contacts 36 and 38 causes a flow of current along the paths 40 and 42. When a magnetic field (shown as a, circle with a dot in the center thereof) is applied perpendicular to the surface of the semiconductor film 32, at each intersection of a first path 40 and a second path 42, the charge carriers are preferentially steered in one direction in a substantially circular path around a corner or opening 43 by the Lorentz force as indicated by the arrows 44. This blocks the flow of electrons along the semiconductor film 32 so as to achieve an increase in the resistance. Thus, the magnetic field applied to the magnetoresistor 30 results in an increase in the magnetoresistance. For the reasons stated with regard to the magnetoresistor 10, the magnetoresistor 30 also has a low temperature coefficient.

The magnetoresistors 10 and 30 may be made by depositing a film of the semiconductor material on the surface of a substrate using any suitable chemical vapor deposition process for the particular material used. Metal contacts are then deposited on the substrate surface at the ends of the semiconductor film either by evaporation in a vacuum or sputtering. The holes 22 in the semiconductor film of the magnetoresistor 10 and the openings between the paths 40 and 42 in the semiconductor film of the magnetoresistor 30 are formed by electron-beam lithography.

Thus, there is provided by the present invention a magnetoresistor in which the paths of the semiconductor film are designed so that when a magnetic field is applied to the semiconductor film, the electrons will flow in a circular path and thereby increase the resistance of the magnetoresistor. The factors which affect this increase in resistance are temperature independent so that the temperature coefficient of the magnetoresistor is low.

It is to be understood that the embodiments of the invention which have been described are illustrative of the invention. Modifications may readily be devised by those skilled in the art without departing from the spirit of the invention.

The embodiments of the invention in which an exclusive property or privilege is claimed are defined as follows:

1. A magnetoresistor comprising:

a thin film of a degenerately doped semiconductor material that is generally rectangular on its major faces, and a pair of conductive contacts at a pair of opposed end edges of the film in ohmic contact with the film; and a series of non-linear paths, formed by openings extending through the film, which extend between said contacts such that when a magnetic field is applied perpendicular to a major surface of the film, it causes electrons flowing through the film in a direction between the contacts to flow in a series of substantially arcuate paths around said openings and thereby provides an increase in film electrical resistance between the contacts, which resistance has a lower temperature coefficient than is available from magnetodiodes or magnetoresistors whose magnetic sensitivity is a function of electron mobility.

2. The magnetoresistor of claim 1 wherein the film is of a thickness of no greater than 5 micrometers.

3. The magnetoresistor of claim 2 wherein the openings are arranged in a plurality of groups, the openings in each group are disposed in substantially a straight line, the lines are substantially perpendicular to a straight line between said contacts, with the openings in adjacent lines being staggered, effective to form parallel linear rows of uninterrupted film between said lines of film openings that are substantially perpendicular to a straight line between said contacts, in which said rows are integrally interconnected by means of film portions between the openings in said line.

4. The magnetoresistor of claim 3 wherein the width of the path is no greater than the mean free path of electrons through the film.

5. The magnetoresistor of claim 4 wherein the openings are circular holes.

6. The magnetoresistor of claim 5 wherein the circular holes have a perimeter no greater than the mean free path of electrons in the semiconductor film.

7. The magnetoresistor of claim 4 wherein the openings are rectangular having a dimension N in a direction generally parallel the side edges of the film no greater than one-third the mean free path of electrons through the film and a dimension in a direction generally perpendicular to side edges of the film of about 2N.

8. The magnetoresistor of claim 7 wherein the contacts provide straight line facing edges, the edges are parallel to each other and generally perpendicular side edges of the film, the paths of the film have spaced parallel first portions extending parallel to the facing line edges of the contacts and spaced parallel second portions extending between and perpendicular to the first portions to form the rectangular openings.

9. The magnetoresistor of claim 8 wherein the width of the paths is about 0.4 of the spacing between the first paths.

* * * * *